(12) United States Patent
Yamamoto et al.

(10) Patent No.: US 6,369,884 B1
(45) Date of Patent: *Apr. 9, 2002

(54) METHOD OF AND APPARATUS FOR BONDING LIGHT-EMITTING ELEMENT

(75) Inventors: Kiyohumi Yamamoto, Minamiashigara; Katsuhiro Miura, Mitaka, both of (JP)

(73) Assignee: Fuji Photo Film Co., Ltd., Kanagawa (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/548,273

(22) Filed: Apr. 12, 2000

(30) Foreign Application Priority Data

Apr. 12, 1999 (JP) ............................................. 11-104553

(51) Int. Cl.[7] .................................................. G01J 1/00
(52) U.S. Cl. ...................................... 356/121; 356/400
(58) Field of Search ................................. 356/121, 122, 356/375, 399, 400, 614, 621; 362/249, 250, 800; 438/118, 26, 975; 29/837, 842; 257/82

(56) References Cited

U.S. PATENT DOCUMENTS

| 4,498,767 A | * | 2/1985 | McGovern et al. .......... 356/121 |
| 4,672,201 A | * | 6/1987 | Welker ........................ 356/401 |
| 4,695,720 A | * | 9/1987 | Rieder et al. ............. 250/231.14 |
| 5,822,053 A | * | 10/1998 | Thrailkill ..................... 356/237 |
| 6,034,779 A | * | 3/2000 | Yamaura ..................... 356/375 |
| 6,208,419 B1 | * | 3/2001 | Yamamoto et al. .......... 356/400 |

FOREIGN PATENT DOCUMENTS

| JP | 1-43112 | 2/1995 | ........... G01B/11/00 |
| JP | 2000-183404 | * | 6/2000 |

* cited by examiner

Primary Examiner—Hoa Q. Pham
(74) Attorney, Agent, or Firm—Sughrue Mion, PLLC

(57) ABSTRACT

A light-transmissive support disk supports a tube for attracting an LED chip, and a light-transmissive electrically conductive film is disposed on the support base. The LED chip is electrically connected to a negative terminal of a DC power supply by the light-transmissive electrically conductive film. An imaging unit is disposed coaxially with the tube and has a CCD camera for capturing an image of a light-emitting state of the LED chip via the support disk and a cover member when the LED chip attracted by the tube emits light. The light-emitting center of the LED chip can be detected accurately, and bonded easily and highly accurately on a board at a desired position thereon.

13 Claims, 19 Drawing Sheets

F I G. 2
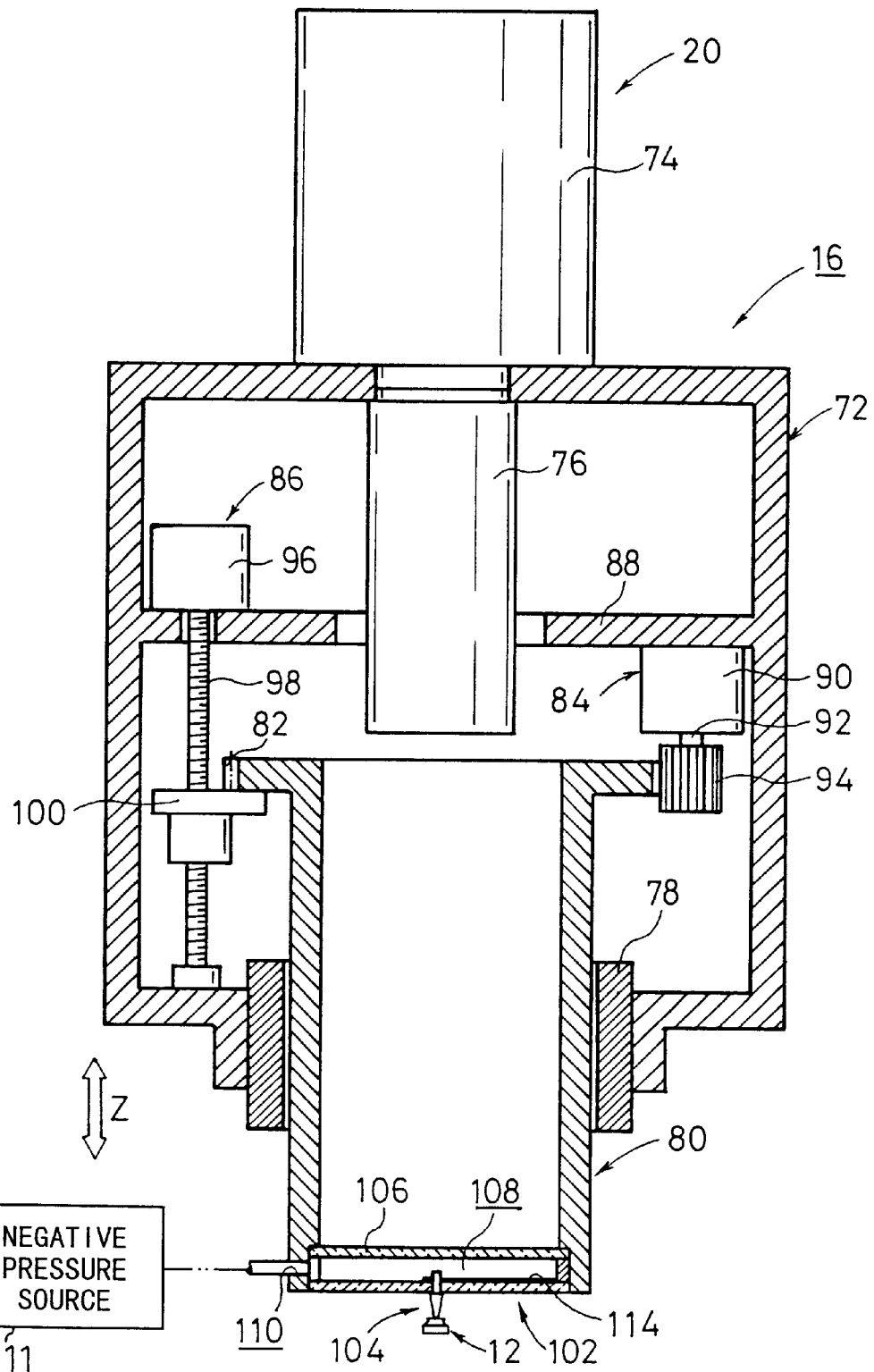

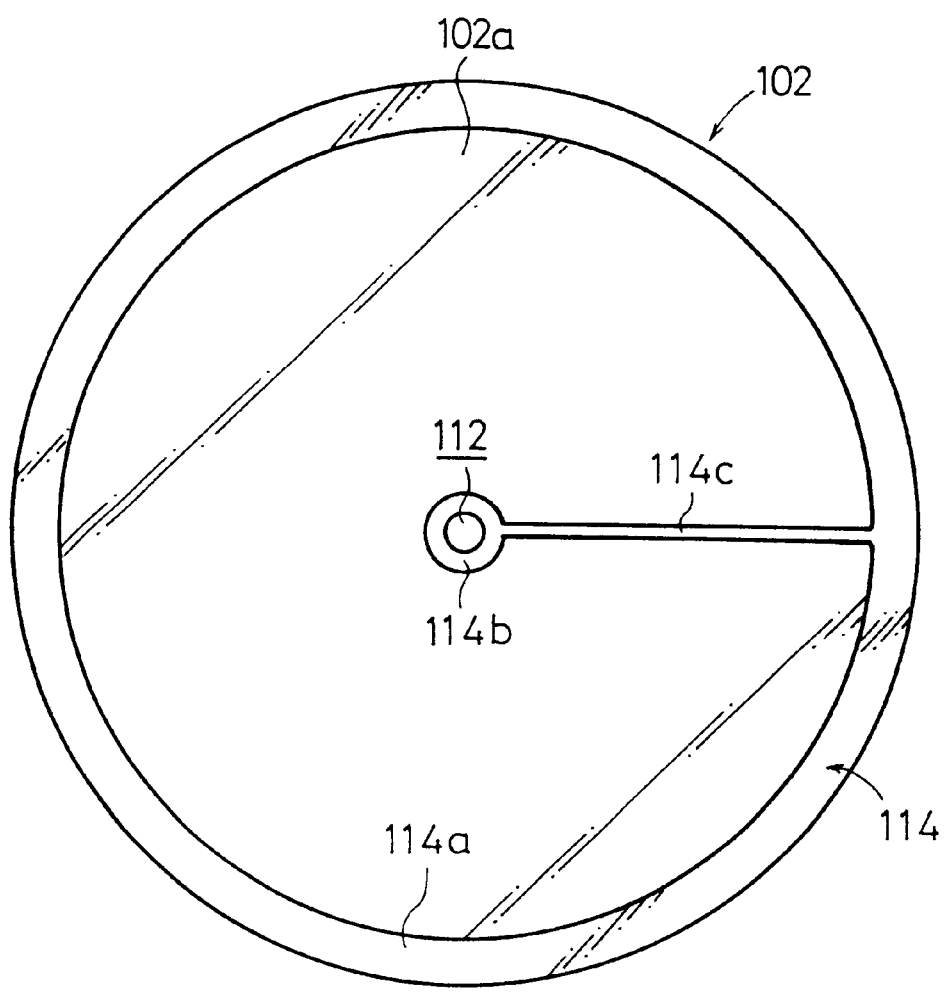
F I G. 4

F I G.14
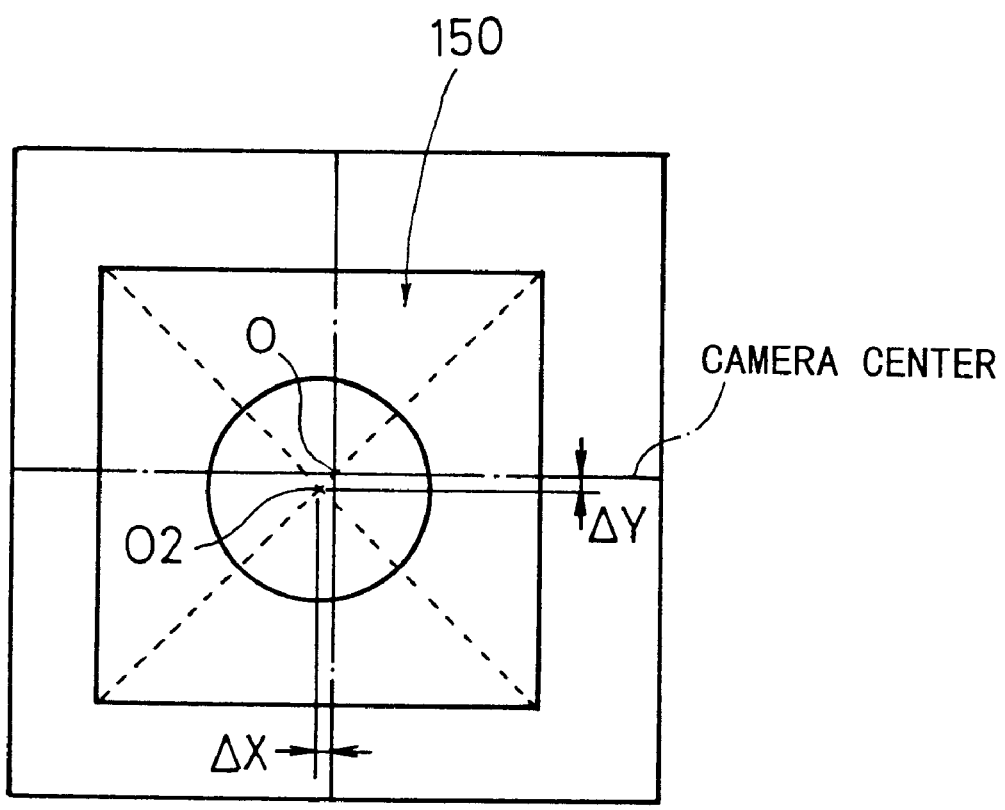

F I G.19
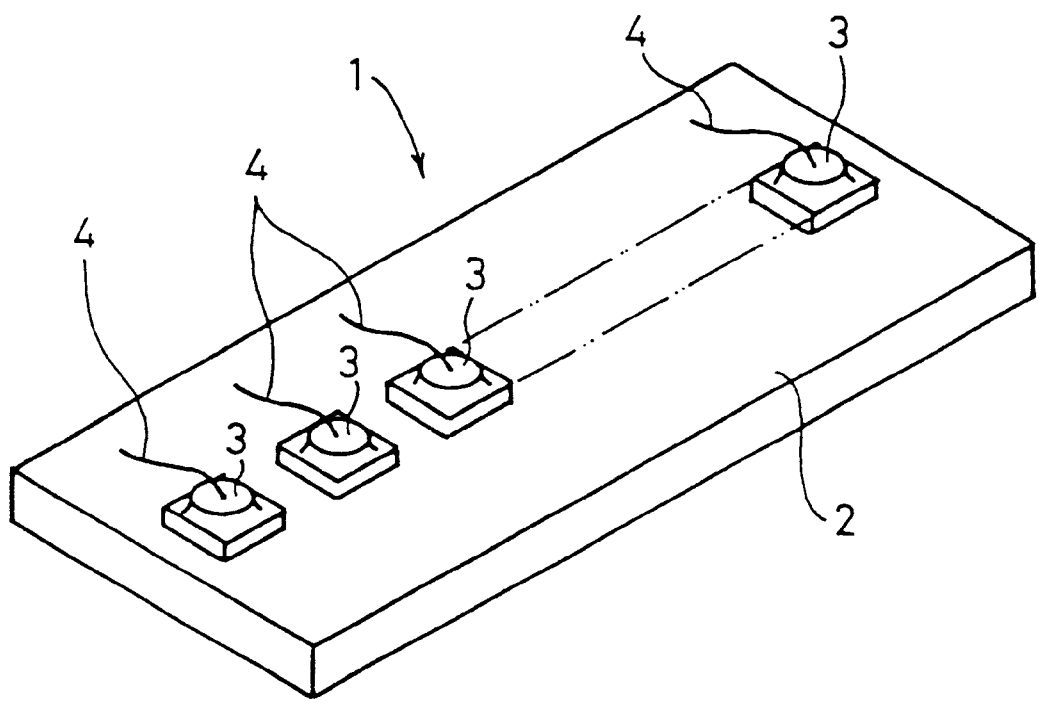

METHOD OF AND APPARATUS FOR BONDING LIGHT-EMITTING ELEMENT

BACKGROUND OF THE INVENTION

1. Field of the Invention

The present invention relates to a method of and an apparatus for bonding a light-emitting element to a board at a predetermined position thereon.

2. Description of the Related Art

Generally, a linear array of light-emitting elements such as laser diodes (LDs), light-emitting diodes (LEDs), or the like is used as a light source for image reading and outputting (recording) applications. For example, as shown in FIG. 19 of the accompanying drawings, an LED array 1 comprises a plurality of LED chips (light-emitting elements) 3 mounted on a board 2 at equally spaced intervals and arranged in a linear pattern extending in one direction. The LED chips 3 are bonded on the board 2 by silver paste, with gold wires 4 extending from the respective LED chips 3.

The LED array 1 requires that the LED chips 3 be aligned highly accurately on the board 2 such that the LED chips 3 have respective light-emitting centers spaced at equal intervals. To meet such a requirement, it is necessary to recognize the light-emitting center of each LED chip 3 from the vertical direction in which the LED chip 3 emits light. However, since the LED chip 3 is a very small chip having dimensions of 0.3 mm×0.3 mm, when the LED chip 3 is attracted by a collet, the LED chip 3 is concealed almost in its entirety by the collet. Therefore, when the LED chip 3 is attracted by the collet, the collet makes it difficult to confirm the light-emitting center of the LED chip 3 or even the outer configuration of the LED chip 3.

Inasmuch as the LED chip 3 is a very small chip, it is not easy to apply an alignment mark to the LED chip 3 and hence the LED chip 3 cannot be bonded on the board 2 according to a normal alignment process. If the LED chip 3 is bonded on the basis of the recognized outer configuration thereof, then because the light-emitting center of the LED chip 3 and the center of the outer configuration thereof generally do not agree with each other, the light-emitting centers of the LED chips 3 tend to be misaligned with each other even when the LED chips 3 are positioned accurately the basis of the recognized outer configuration thereof.

Japanese laid-open patent publication No. 7-43112 discloses a method of detecting the light-emitting spot of a light-emitting element and an apparatus for positioning such a light-emitting element. According to the disclosed method and apparatus, when a semiconductor device laser chip is attracted by an attraction nozzle and delivered to a positioning location, a current is supplied to energize the semiconductor device laser chip, and a CCD camera positioned in facing relationship to a light-emitting area of the semiconductor device laser chip detects light emitted from the semiconductor device laser chip. An image generated by the CCD camera based on the detected light is supplied to a controller, which detects the position and orientation of the semiconductor device laser chip based on the image, and controls the attraction nozzle to correct the attitude of the semiconductor device laser chip.

However, since the disclosed arrangement employs the semiconductor device laser chip as a light-emitting element, it cannot be applied to LED chips whose light-emitting areas have a complex shape. Inasmuch as the semiconductor device laser chip has a chip attraction surface and a light-emitting surface which are different from each other, the light-emitting state of the semiconductor device laser chip can easily be detected while the semiconductor device laser chip is being attracted. However, it is quite difficult to detect the light-emitting center of an LED chip because the LED chip has a chip attraction surface and a light-emitting surface which are oriented in the same direction. Another problem is that when a probe is applied to the LED chip to cause the LED chip to emit light, the probe conceals the light-emitting area of the LED chip, making it difficult to detect the light-emitting center of the LED chip.

SUMMARY OF THE INVENTION

It is a major object of the present invention to provide a method of and an apparatus for bonding a light-emitting element by reliably detecting the light-emitting center of the light-emitting element and positioning the light-emitting element highly accurately and easily on a board.

The above and other objects, features, and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIG. 2 is a vertical cross-sectional view of a collet unit of the bonding apparatus;

FIG. 4 is a plan view of the support disk;

FIG. 14 a diagram showing a positional deviation between the light-emitting center of the LED chip and the center of the CCD camera;

FIG. 19 is a perspective view of an ordinary LED array.

DESCRIPTION OF THE PREFERRED EMBODIMENTS

Figure 1:
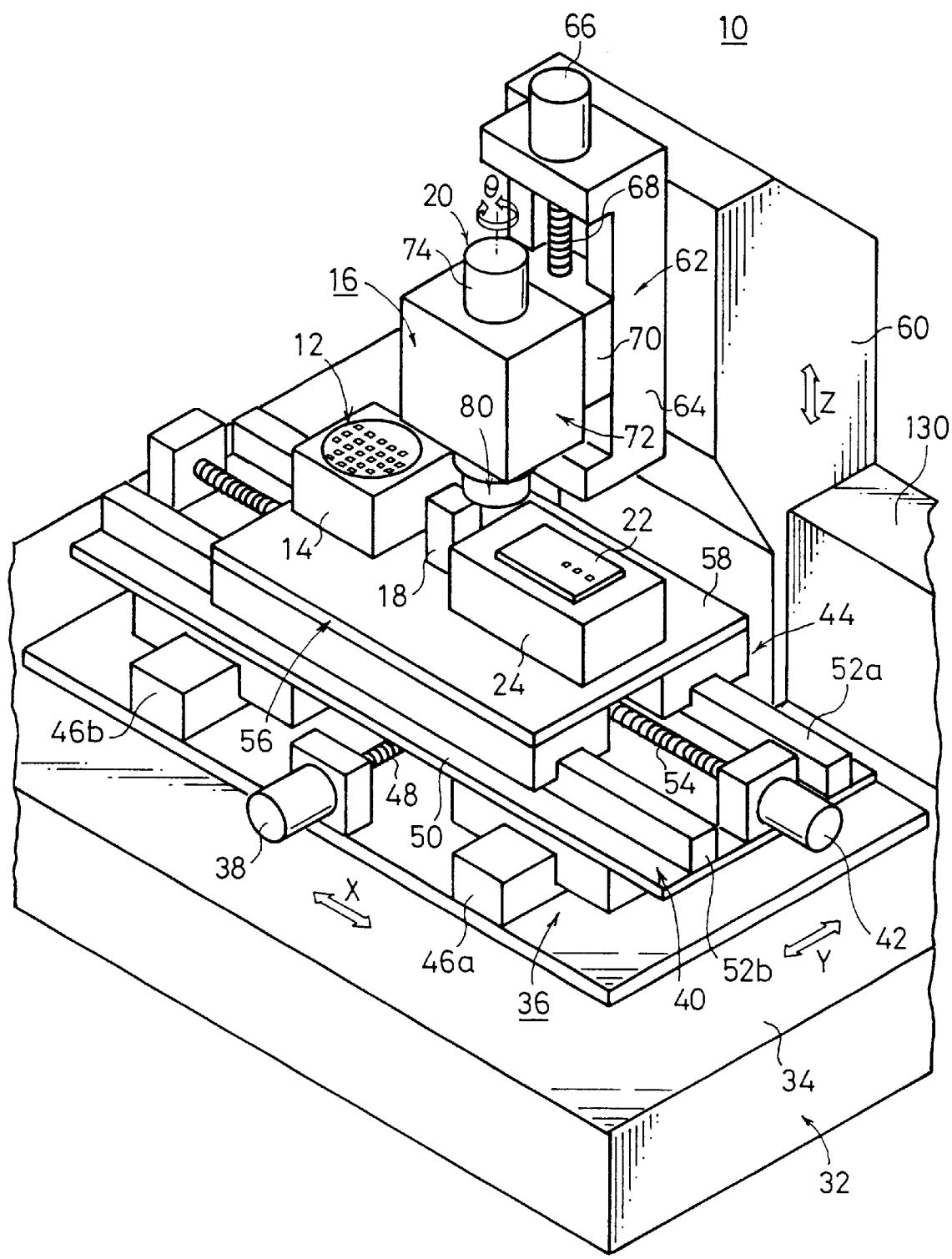
FIG. 1 is a perspective view of a bonding apparatus for carrying out a method of bonding a light-emitting element according to a first embodiment of the present invention.

FIG. 1 shows in perspective a bonding apparatus 10 for carrying out a method of bonding a light-emitting element according to a first embodiment of the present invention.

The bonding apparatus 10 generally comprises a chip laying base 14 for holding LED chips 12 as light-emitting elements in a two-dimensional pattern, a collet unit 16 for attracting and holding an LED chip 12, a light-emitting base (light-emitting means) 18 for energizing a light-emitting area of the LED chip 12 attracted and held by the collect unit 16, an imaging means 20 for imaging a light-emitting state of the LED chip 12, and a bonding base 24 for bonding the LED chip 12 on a board 22.

A displacement mechanism 36 is mounted on an upper surface 34 of a mount base 32 of the bonding apparatus 10. The displacement mechanism 36 has a first movable stage 40 movable along a Y-axis of an orthogonal coordinate system by a first motor 38 and a second movable stage 44 movable along an X-axis of the orthogonal coordinate system with respect to the first movable stage 40 by a second motor 42.

The first movable stage 40 comprises a pair of guide rails 46a, 46b extending along the Y-axis and a ball screw 48 disposed between guide rails 46a, 46b and extending along the Y-axis. The first motor 38 has an output shaft coupled to an end of the ball screw 48. The ball screw 48 is threaded through a nut (not shown) fixed to a lower surface of a Y-axis movable table 50 that is movably supported on the guide rails 46a, 46b.

The Y-axis movable table 50 is of an elongate shape along the X-axis. The Y-axis movable table 50 supports thereon a pair of guide rails 52a, 52b extending along the X-axis and a ball screw 54 disposed between guide rails 52a, 52b and extending along the X-axis. The guide rails 52a, 52b and the ball screw 54 belong to the second movable stage 44. The second motor 42 has an output shaft coupled to an end of the ball screw 54. The ball screw 54 is threaded through a nut (not shown) fixed to a lower surface of an X-axis movable table 56 that is movably supported on the guide rails 52a, 52b.

The X-axis movable table 56 supports on an upper surface 58 thereof the chip laying base 14, the light-emitting base 18, and the bonding base 24. The light-emitting base 18 is electrically connected to the positive terminal (positive pole) of a DC power supply (not shown).

A column 60 is vertically mounted on an end of the mount base 32, and a third movable stage 62 for moving the collet unit 16 vertically along a Z-axis of the orthogonal coordinate system is supported on the column 60. The third movable stage 62 has a frame 64 fixed to a vertical surface of the column 60, a third motor 66 fixedly mounted on an upper end of the frame 64, and a ball screw 68 connected to the output shaft of the third motor 66 and extending along the Z-axis and threaded through a vertically movable base 70 guided by the frame 64.

The collet unit 16 has a casing 72 fixed to the vertically movable base 70. As shown in FIG. 2, the imaging means 20 has a CCD camera 74 mounted on an upper end of the casing 72 and a magnifying optical system 76 housed in the casing 72 and disposed coaxially with an optical axis extending along the Z-axis from the CCD camera 74. An electrically conductive movable tube 80 is mounted in a lower end of the casing 72 by an air bearing 78. The movable tube 80 has on its upper end a gear 82 extending radially outwardly and held in mesh with a θ-axis movable means (rotating means) 84 and a Z-axis movable means (moving means) 86.

The θ-axis movable means 84 has a fourth motor 90 fixed to a lower surface of a partition wall 88 disposed in the casing 72 and the fourth motor 90 has a rotatable shaft 92 with a gear 94 mounted thereon. The gear 94 is held in mesh with the gear 82 of the movable tube 80. The Z-axis movable means 86 has a fifth motor 96 fixed to an upper surface of the partition 88 and the fifth motor 96 has a rotatable shaft (not shown) to which a ball screw 98 is connected. The ball screw 98 extends along the Z-axis from the partition wall 88 to the lower end of the casing 72, and is threaded through a vertically movable member 100 which supports a lower end of the gear 82 of the movable tube 80.

The movable tube 80 supports in its lower end a light-transmissive support disk (light-transmissive support member) 102 made of glass, synthetic resin, or the like to which there is secured an electrically conductive tube 104 as a holder. The movable tube 80 holds therein a light-transmissive cover member 106 spaced a distance upwardly from the support disk 102, the cover member 106 and the support disk 102 defining a suction chamber 108 defined therebetween. The suction chamber 108 is connected to a negative pressure source 111 through a hole 110 defined in a side wall of the movable tube 80.

Figure 3:
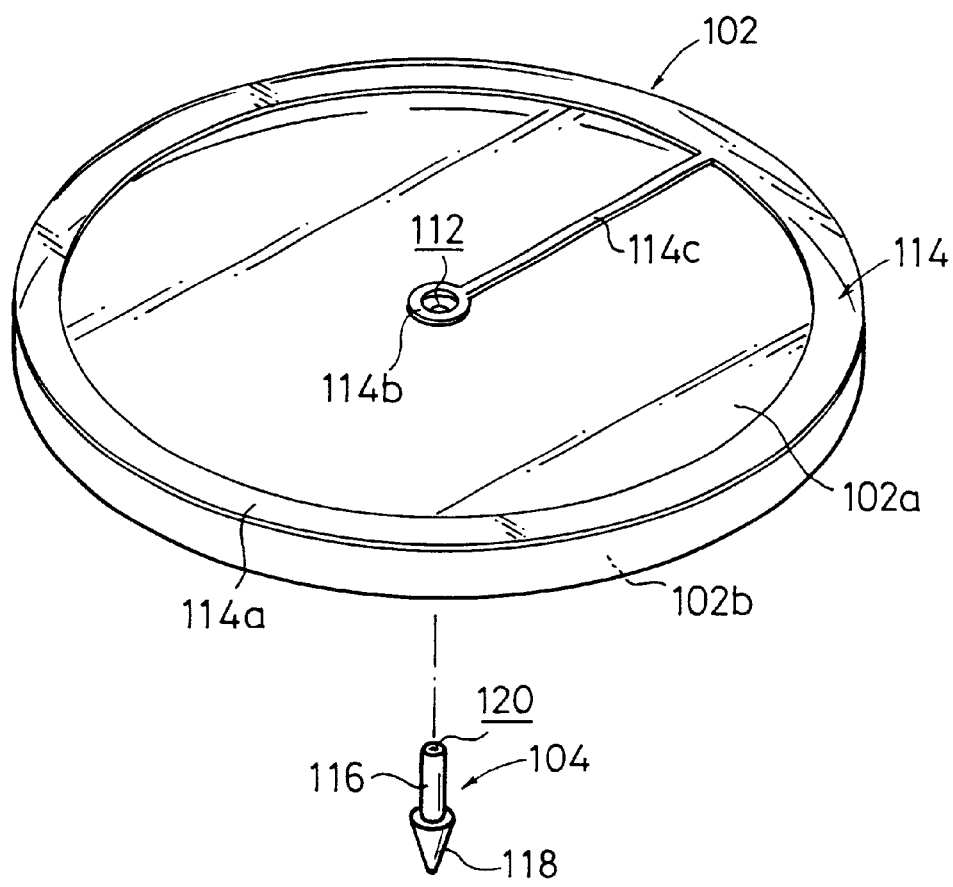
FIG. 3 is a perspective view of a support disk and a tubular body incorporated in the collet unit.

As shown in FIGS. 3 and 4, the support disk 102 has a through hole 112 defined centrally therein and supports a light-transmissive electrically conductive film 114 disposed on a surface 102a thereof which faces the suction chamber 108. The light-transmissive electrically conductive film 114 comprises a large-diameter annular portion 114a extending along an outer circumferential edge of the surface 102a, a small-diameter annular portion 114b extending around the through hole 112, and a radial straight portion 114c extending radially and interconnecting the large-diameter annular portion 114a and the small-diameter annular portion 114b. The light-transmissive electrically conductive film 114 has a thickness of, for example, 1 μm.

Figure 5:
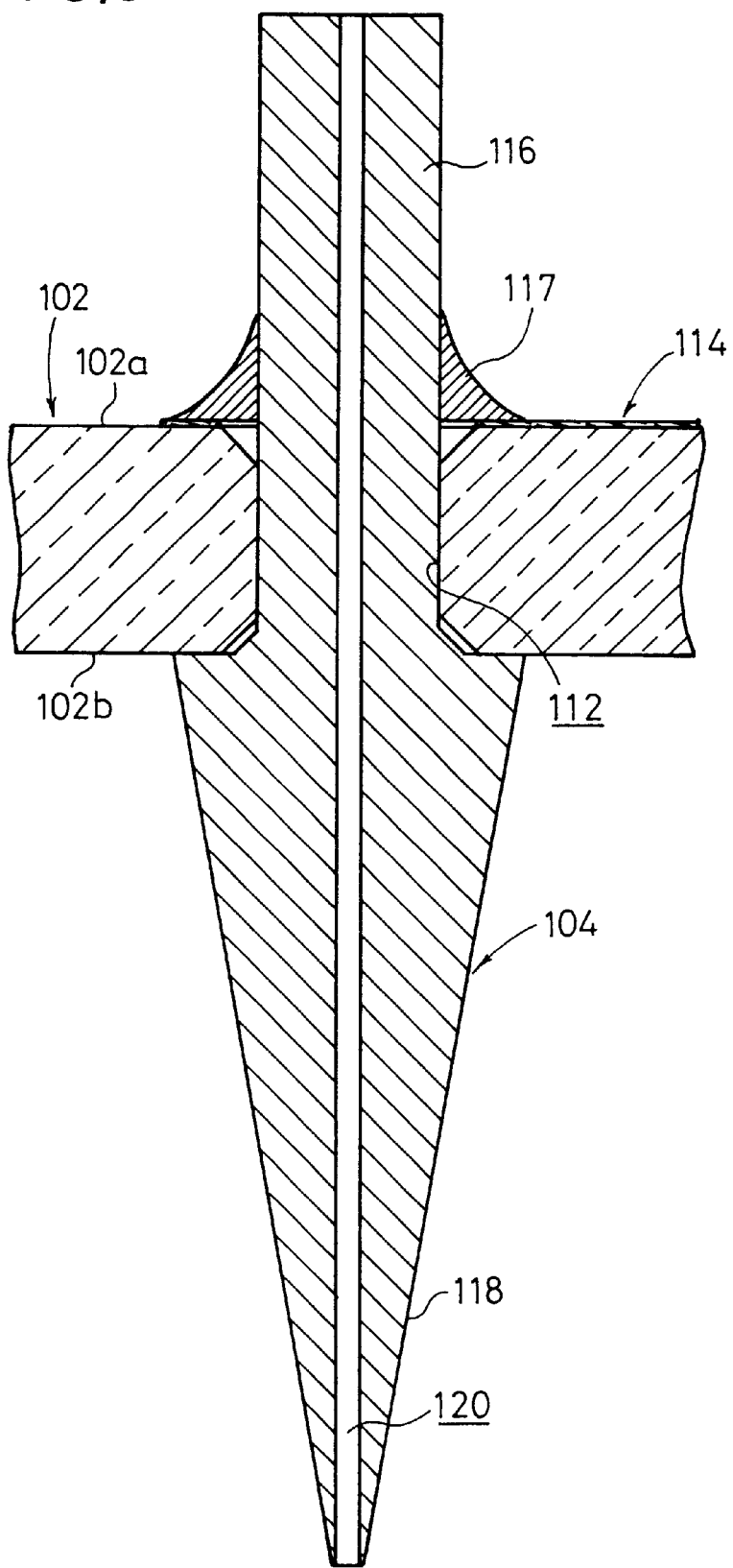
FIG. 5 is an enlarged fragmentary vertical cross-sectional view of the support disk and the tubular body.

As shown in FIGS. 3 and 5, the electrically conductive tube 104 has a joining member 116 inserted in the through hole 112 in the support disk 102 and projecting a predetermined length from the surface 102a. The joining member 116 is bonded to the surface 102a by an electrically conductive adhesive 117 such as silver paste, for example. The joining member 116 has a tapered end portion 118 held in contact with a surface 102b of the support disk 102 opposite to the surface 102a and progressively smaller in diameter away from the surface 102b. The electrically conductive tube 104 has an axial through hole 120 defined centrally therein.

The axial through hole 120 has a diameter of 0.1 mm, and the electrically conductive tube 104 has a maximum diameter of 1.55 mm at its portion held in contact with the surface 102b, a minimum diameter of 0.14 mm at its tapered end, and a length of 4 mm. These dimensions are selected in view of the fact that each of the LED chips 12 has a size of 0.3 mm×0.3 mm and an upper electrode (described later on) thereof has a diameter of 0.17 mm. The electrically conductive film 114 on the support disk 102 is connected via the movable-tube 80 to the negative terminal (negative pole) of the DC power supply (not shown).

As shown in FIG. 1, an image processor (image processing means) 130 for processing an image captured by the imaging means 20 to recognize the position of the light-emitting center of the LED chip 12 is mounted on the mount base 32.

Operation of the bonding apparatus 10 will be described below with reference to FIGS. 6 and 7.

As shown in FIG. 1, a plurality of LED chips 12 are disposed in a two-dimensional pattern on the chip laying base 14, and the board 22 coated with silver paste is placed on the bonding base 24. The board 22 has an edge in the X-axis direction positioned in alignment with a station reference surface (not shown). The board 22 is attracted to the bonding base 24 under a vacuum developed via a suction hole (not shown) defined in the bonding base 24. The light-emitting base 18 is connected to a positive terminal of an unillustrated DC power supply.

Figure 6:
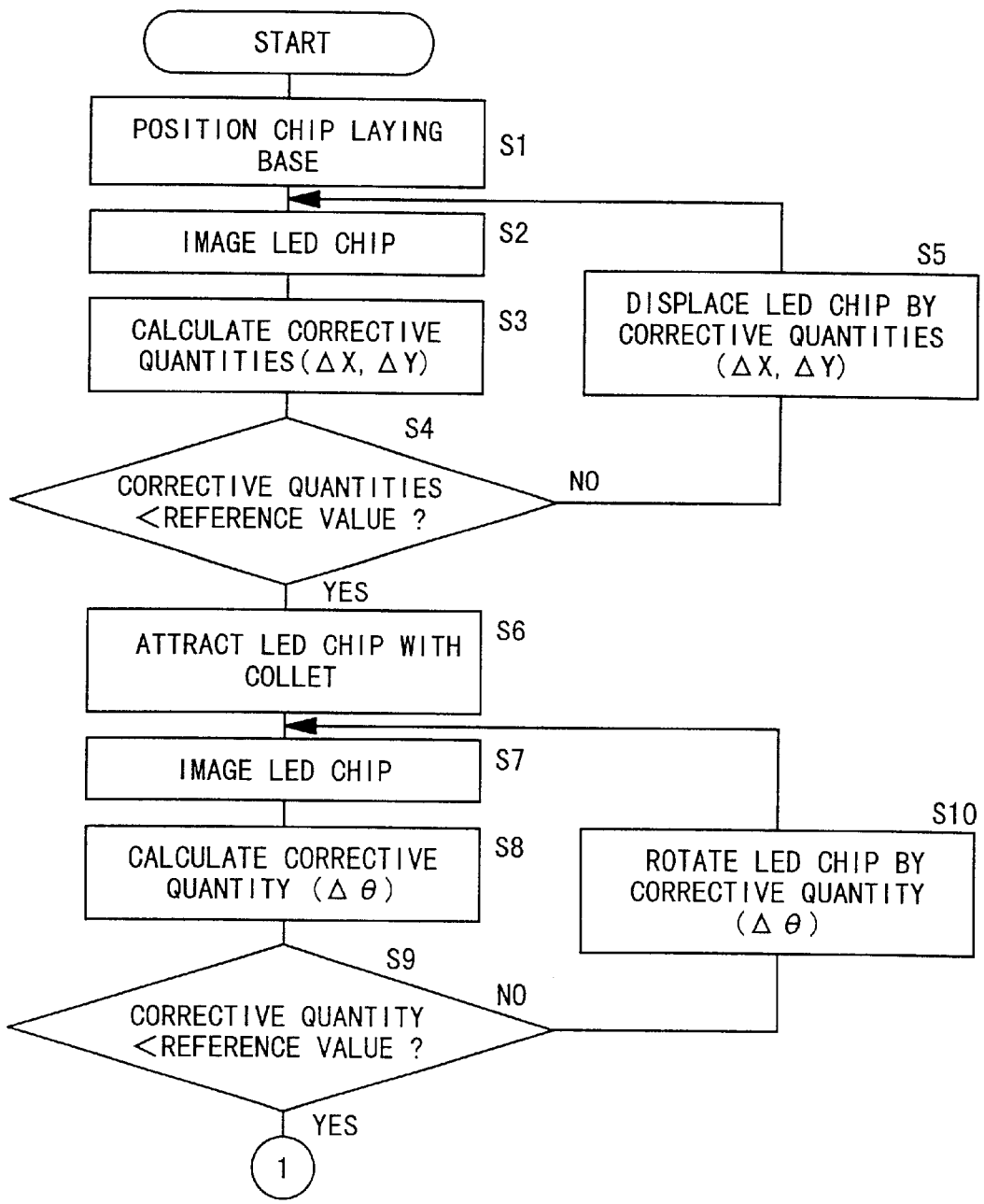
FIGS. 6 and 7 are a flowchart of an operation sequence of the method of bonding a light-emitting element.
Figure 7:
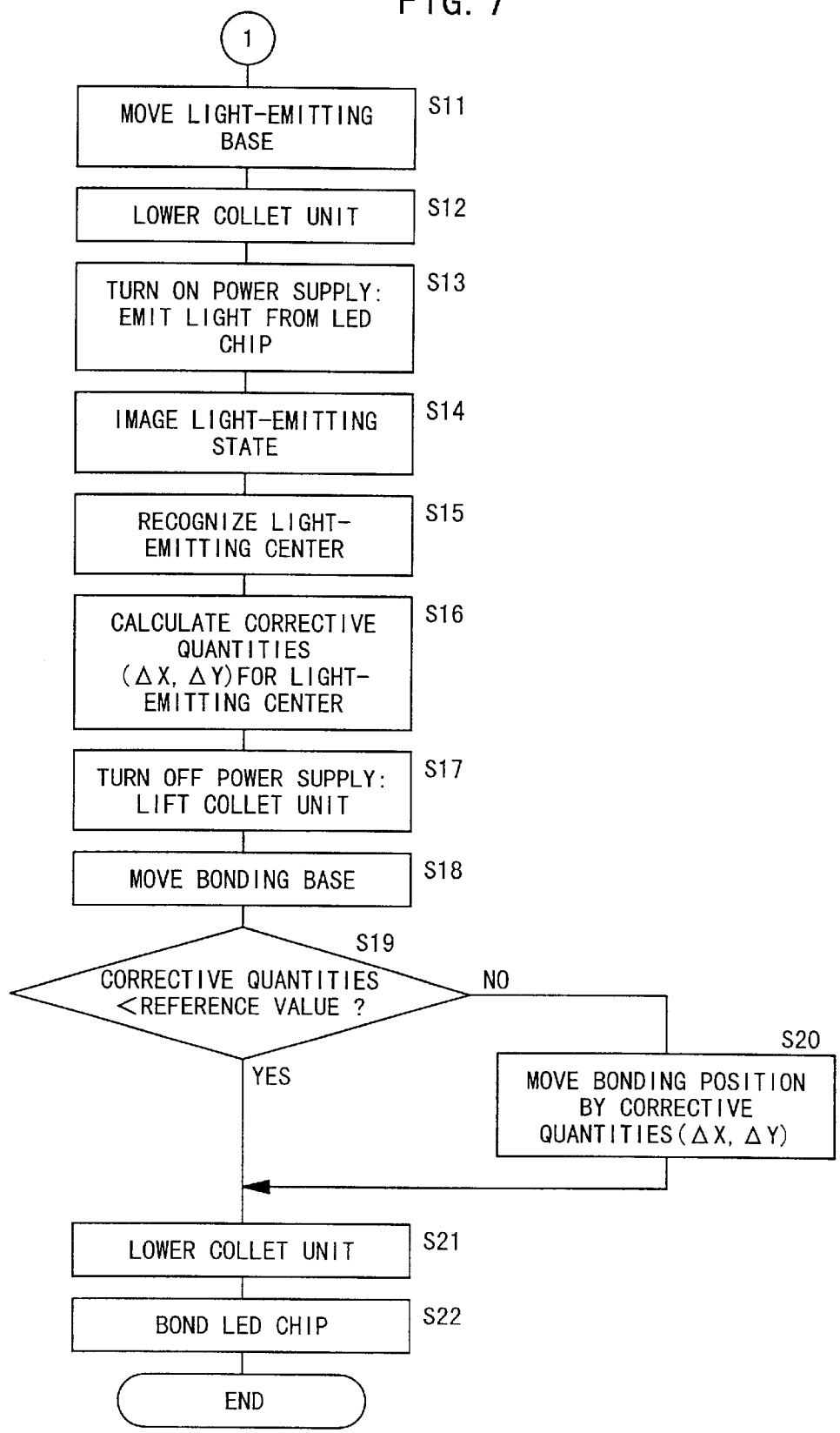

The displacement mechanism 36 is actuated to displace the chip laying base 14 to a position corresponding to the camera center (collet center) of the imaging means 20, i.e., a chip removal position, in step SI (FIG. 6). Specifically, the first motor 38 is energized to rotate the ball screw 48 about its own axis to move the Y-axis movable table 50 along the Y-axis, and the second motor 42 is energized to rotate the ball screw 54 about its own axis to move the X-axis movable table 66 along the X-axis. Therefore, when the first and second motors 38, 42 are energized, one of the LED chips 12 on the chip laying base 14 is brought into the chip removal position.

Figure 8:
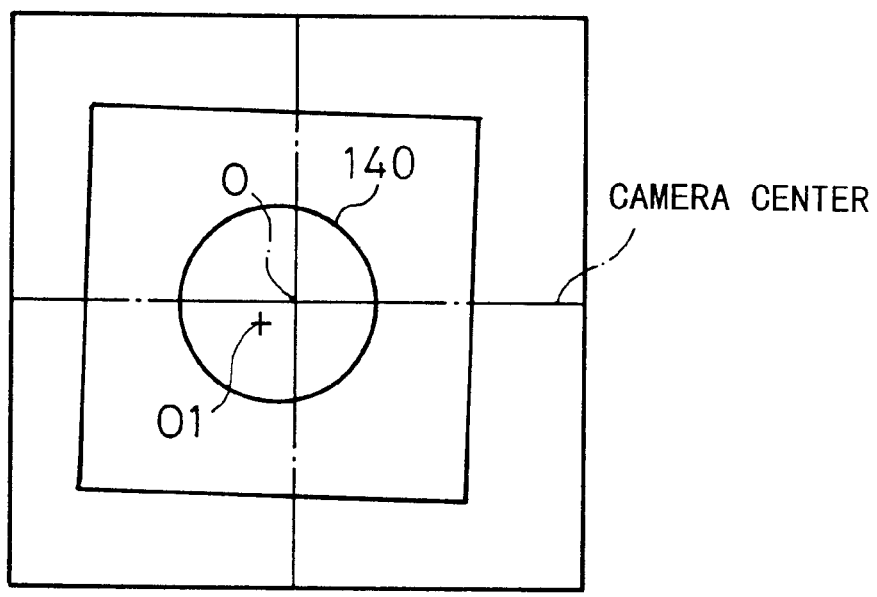
FIG. 8 is a view showing an image of an LED chip which is captured by a CCD camera.

Then, the CCD camera 74 of the imaging means 20 captures an image of the LED chip 12 on the chip laying base 14 in the chip removal position in step S2. An image signal generated by the CCD camera 74 and representing the LED chip 12 is supplied to the image processor 130, which processes the image signal. Specifically, as shown in FIG. 8, the image processor 130 recognizes the center O1 of an upper electrode 140 of the LED chip 12, and calculates a deviation of the upper electrode center O1 from the center O of the CCD camera, i.e., corrective quantities (ΔX, ΔY) for the LED chip 12 in step S3.

The calculated corrective quantities are compared with a preset reference value in step S4. If the calculated corrective quantities are greater than the preset reference value, then the displacement mechanism 36 is actuated to move the LED chip 12 by distances corresponding to the corrective quantities in step S5. Specifically, the first motor 38 is energized to move the LED chip 12 by a distance corresponding to the corrective quantity ΔY, and the second motor 42 is energized to move the LED chip 12 by a distance corresponding to the corrective quantity ΔX.

If the calculated corrective quantities are equal to or smaller than the preset reference value, then the collet unit 16 attracts the LED chip 12 in step S6. Specifically, as shown in FIG. 2, the fifth motor 96 of the Z-axis movable means 86 in the casing 72 is energized to rotate the ball screw 98 about its own axis, whereupon the vertically movable member 100 threaded over the ball screw 98 is lowered. Since the gear 82 of the movable tube 80 is supported on the vertically movable member 100, the movable tube 80 descends in unison with the vertically movable member 100 until the tip end of the electrically conductive tube 104 contacts the LED chip 12.

Figure 9:
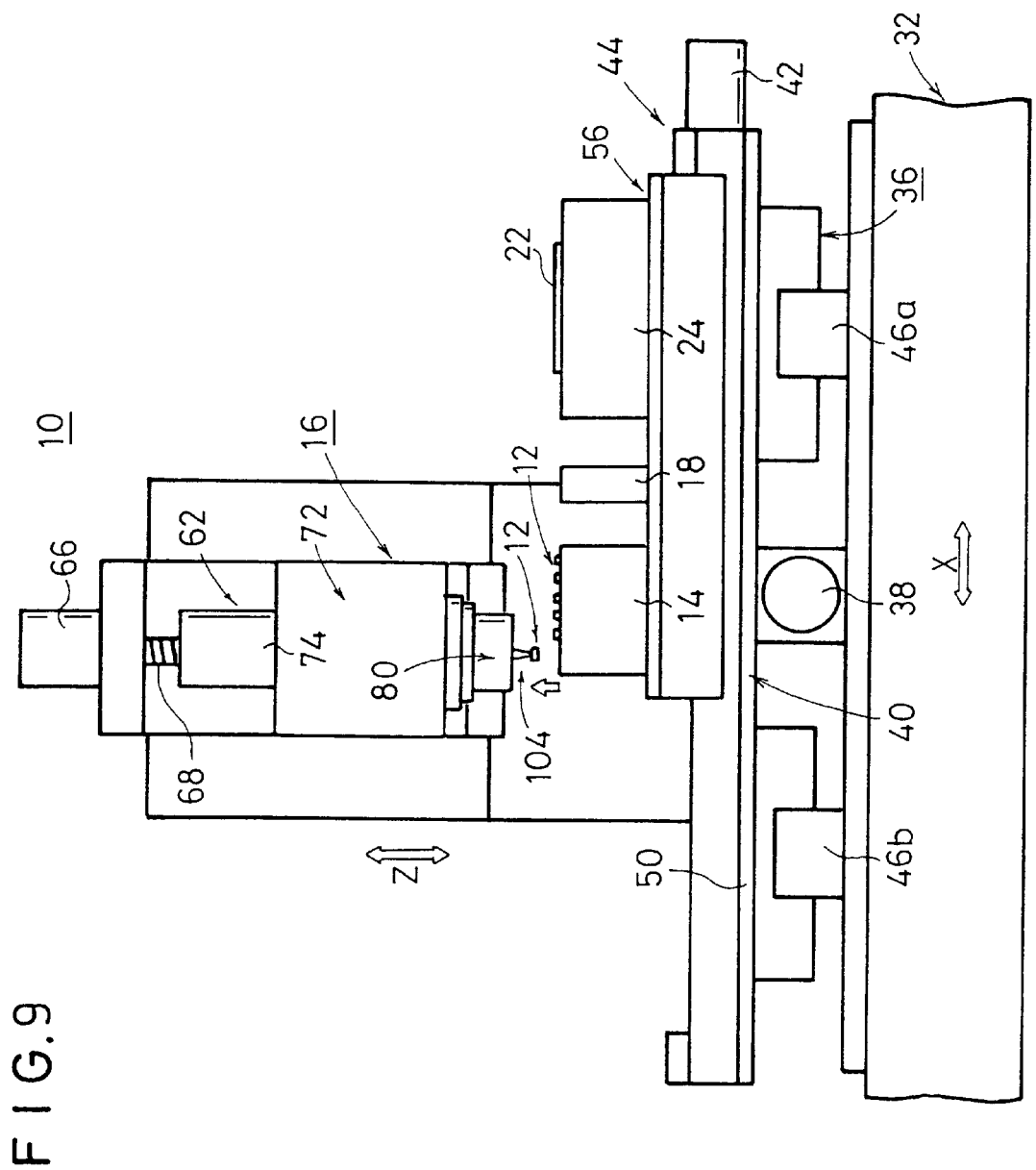
FIG. 9 is a front elevational view showing the manner in which the LED chip is removed from a chip laying base of the bonding apparatus.

Thereafter, the negative pressure source 111 is actuated to evacuate the electrically conductive tube 104 via the suction chamber 108, thereby attracting the LED chip 12 against the tip end of the electrically conductive tube 104. As shown in FIG. 9, the third motor 66 is energized to rotate the ball screw 68 about its own axis to lift the collet unit 16 together with the vertically movable base 70, removing the LED chip 12 attracted by the electrically conductive tube 104 upwardly from the chip laying base 14.

Then, the CCD camera 74 of the imaging means 20 captures an image of the LED chip 12 attracted by the collet unit 16 in step S7. The captured image of the LED chip 12 is processed by the image processor 130, which recognizes an outer edge of the LED chip 12 and calculates a corrective quantity Δθ in step S8. The corrective quantity Δθ is compared with a predetermined reference value in step S9. If the corrective quantity Δθ is greater than the predetermined reference value, control goes to step S10 in which the θ-axis movable means 84 is actuated for an angular interval corresponding to the corrective quantity Δθ.

Specifically, as shown in FIG. 2, the fourth motor 90 of the θ-axis movable means 84 is energized to rotate the gear 94 with the rotatable shaft 92, causing the gear 82 in mesh therewith to rotate the movable tube 80 through an angle corresponding to the corrective quantity Δθ in a given direction. After the LED chip 12 is angularly corrected for the corrective quantity Δθ, the displacement mechanism 36 is actuated to move the X-axis movable table 56 in the X-axis direction to bring the light-emitting base 18 into alignment with the camera center of the imaging means 20 in step S11 (FIG. 7).

Figure 10:
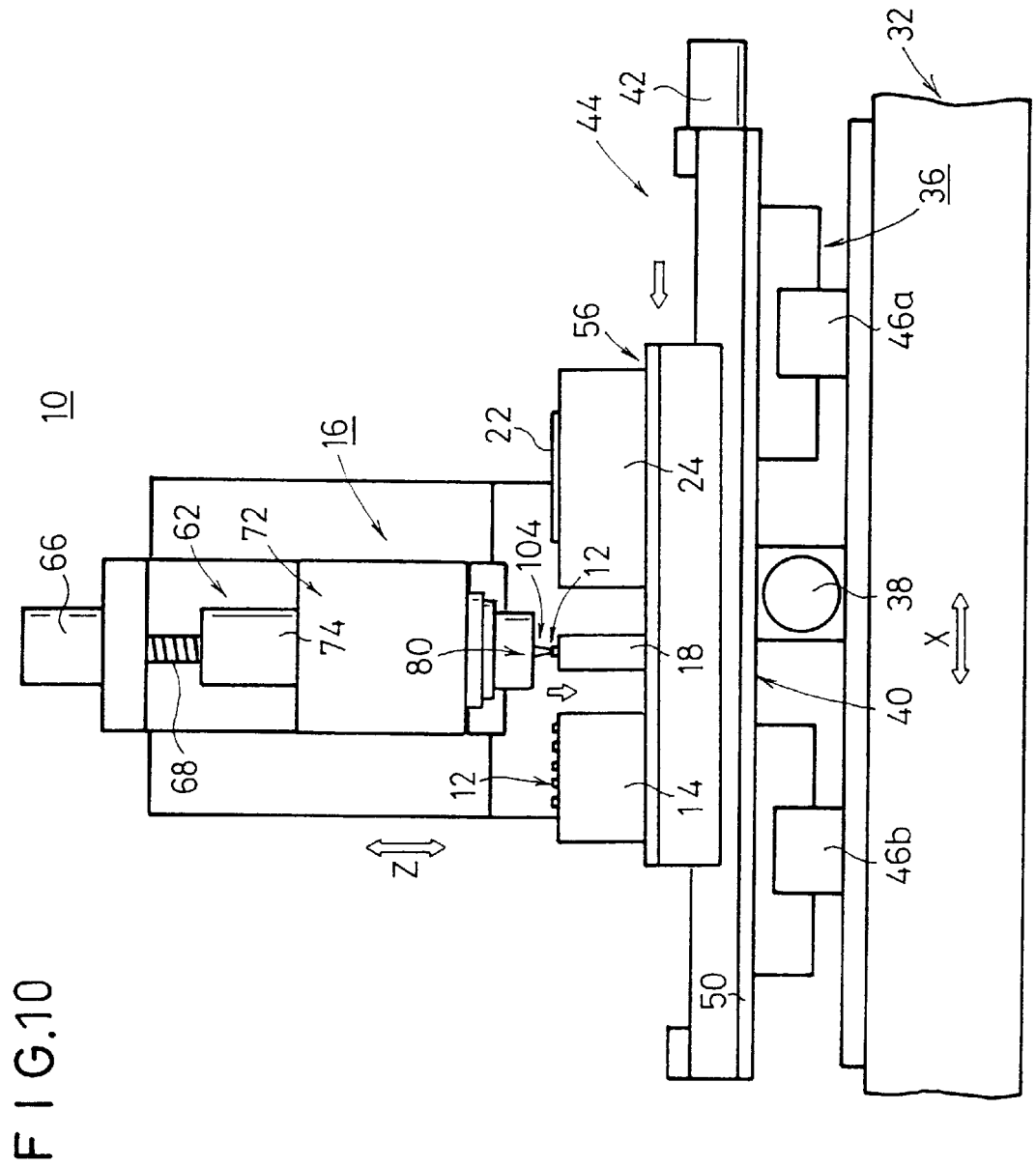
FIG. 10 is a front elevational view showing the manner in which the LED chip is placed on a light-emitting base of the bonding apparatus.

The third motor 66 is energized to cause the vertically movable base 70 to lower the collet unit 16 until a lower electrode of the LED chip 12 attracted by the tip end of the collet unit 16 contacts the light-emitting base 18 in step S12, as shown in FIG. 10.

Figure 11:
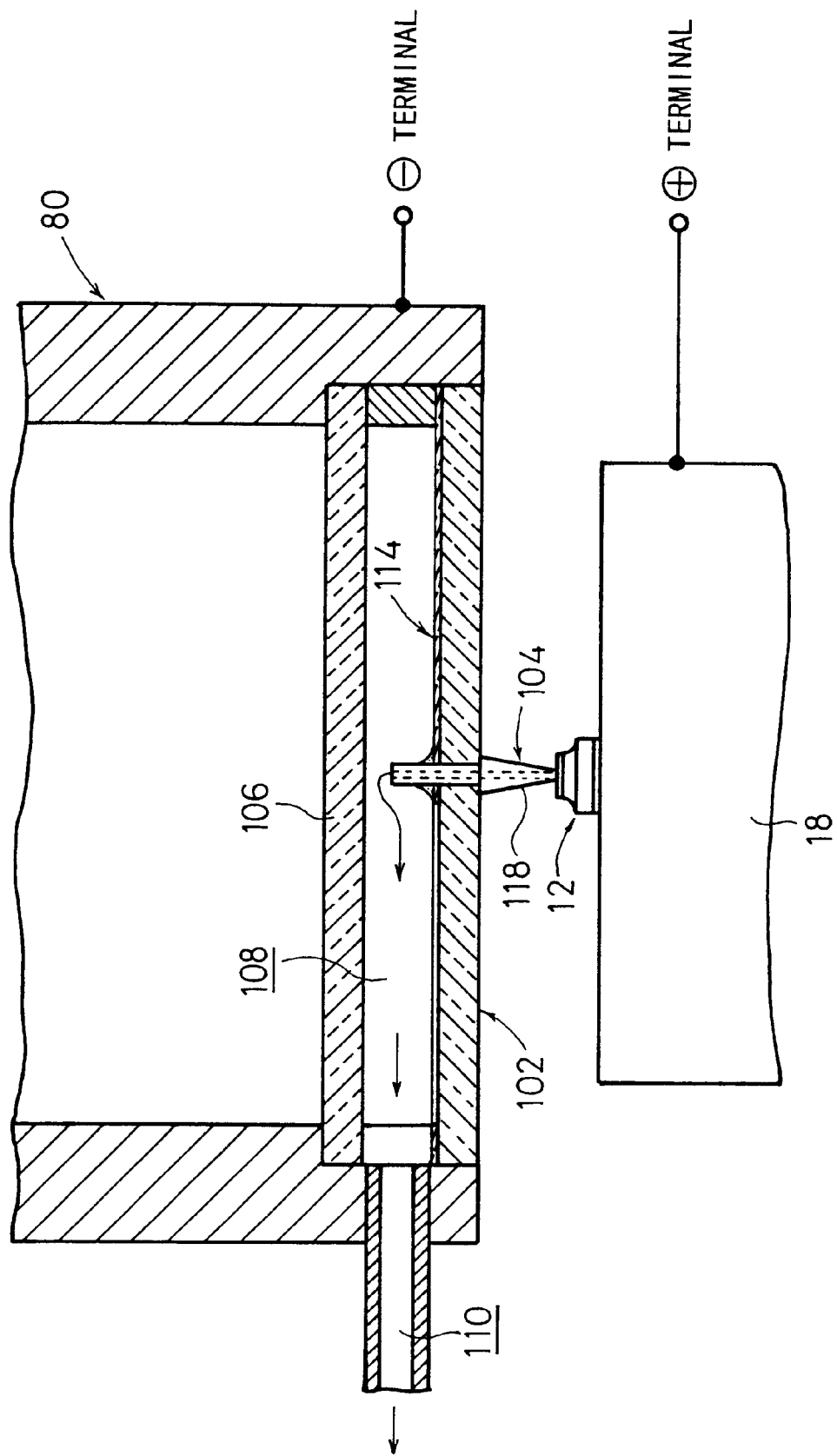
FIG. 11 is an enlarged fragmentary vertical cross-sectional view of the collet unit as it attracts the LED chip.

At this time, as shown in FIG. 11, the light-emitting base 18 is electrically connected to the positive terminal of the non-illustrated DC power supply, and the movable tube 80 is electrically connected to the negative terminal thereof. When a current from the DC power supply is passed through the LED chip 12, the LED chip 12 emits light in step S13. With the LED chip 12 emitting light, the CCD camera 74 captures an image of the light-emitting state of the LED chip 12 via the cover member 106 and the support disk 102 in step S14. The CCD camera 74 sends an image signal representing the light-emitting state of the LED chip 12 to the image processor 130, which recognizes the light-emitting center of the LED chip 12 in step S15.

Figure 12:
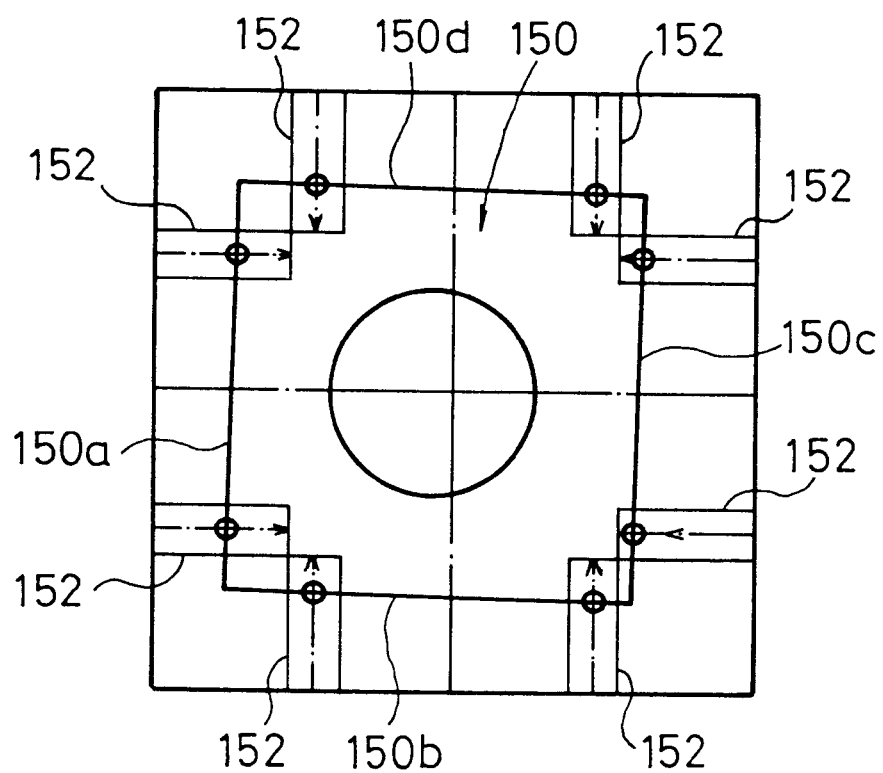
FIG. 12 is a diagram showing the manner in which the light-emitting state of the LED chip is imaged for an image processing process.
Figure 13:
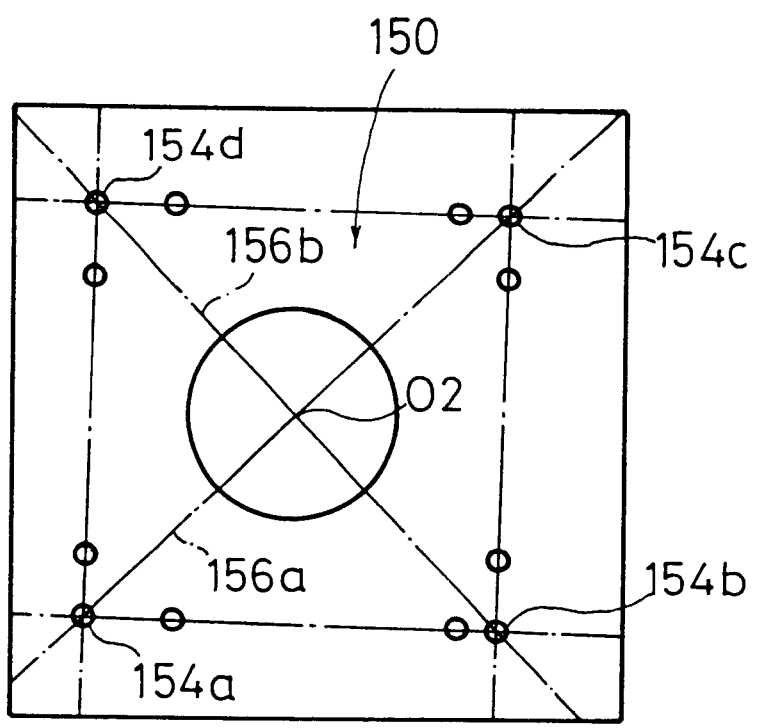
FIG. 13 is a diagram illustrative of the image processing process.

Specifically, as shown in FIG. 12, in a light-emission image 150 represented by the image signal read into the image processor 130, two or more edges of each side are detected by edge detecting windows 152, and four sides 150a–150d of the light-emission image 150 are determined. Then, as shown in FIG. 13, points 154a–154d of intersection of the sides, i.e., the corners of the light-emission image 150, are determined, and a point of intersection of diagonal lines 156a, 156b passing through the points 154a–154d of intersection, i.e., a light-emitting center O2, is determined. Thereafter, as shown in FIG. 14, corrective quantities (ΔX, ΔY) based on a deviation of the light-emitting center O2 from the camera center O are calculated in step S16.

The LED chip 12 is then de-energized, and the collet unit 16 is lifted in unison with the vertically movable base 70 by the third motor 66 in step S17. Control proceeds to step S18 in which the displacement mechanism 36 is actuated to displace a certain bonding position on the board 22 attracted by the bonding base 24 into alignment with the camera center O of the imaging means 20. If the corrective quantities (ΔX, ΔY) calculated in step S16 are greater than a preset reference value (NO in step S19), then control goes to step S20 in which the bonding position on the board 22 is corrected with respect to the camera center O.

Figure 15:
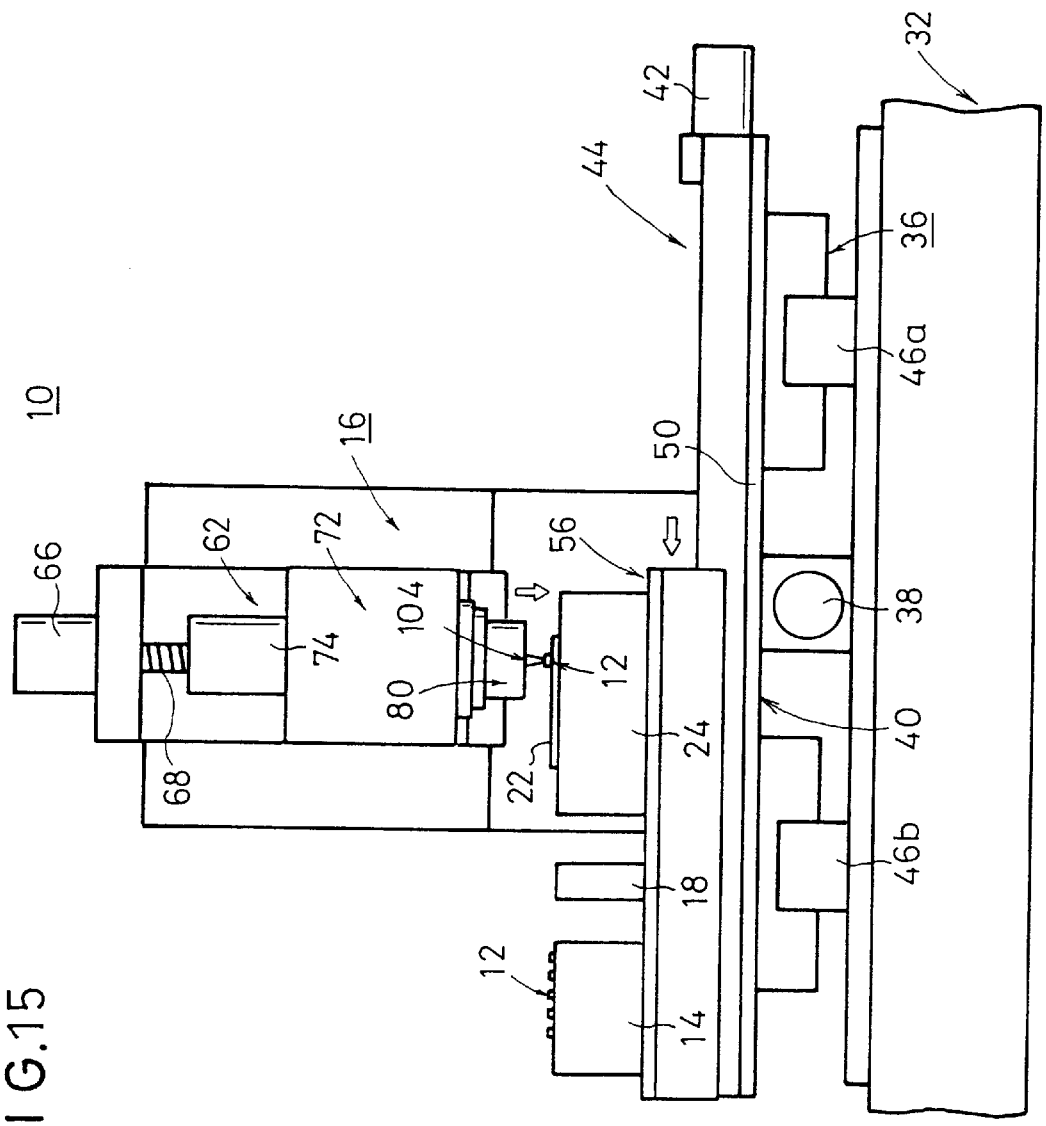
FIG. 15 is a front elevational view showing the manner in which the LED chip is bonded on a board.

The third motor 66 is energized to lower the collet unit 16 to place the LED chip 12 attracted by the collet unit 16 in the bonding position on the board 22 in step S21. Then, the LED chip 12 is bonded on the board 22 in step S22, as shown in FIG. 15.

The other LED chips 12 placed on the chip laying base 14 are processed in the same manner as the processing in step S6 and subsequent steps, so that the other LED chips 12 are successively bonded on the board 22 at respective bonding positions thereon. In this manner, the LED chips 12 are bonded on the board 22 at equal intervals between their light-emitting centers. After all the desired LED chips 12 have been bonded on the board 22, the board 22 is removed from the bonding base 24, and the silver paste is heat-set by an electric oven, for example.

In the first embodiment described above, the light-transmissive electrically conductive film 114 is disposed on the light-transmissive support disk 102 which is made of glass, plastic, or the like, and the electrically conductive tube 104 is electrically connected via the electrically conductive film 114 to the negative terminal of the DC power supply. The light-emitting base 18 is electrically connected to the positive terminal of the DC power supply.

When the LED chip 12 attracted by the electrically conductive tube 104 is energized to emit light, the light-emitting state of the LED chip 12 can reliably be imaged by the CCD camera 74 through the support disk 102 and the cover member 106. Consequently, the light-emitting center of the LED chip 12 attracted by the electrically conductive tube 104 of the collet unit 16 can accurately be recognized, and hence the LED chips 12 can be bonded on the board 22 highly accurately at equal intervals between their light-emitting centers.

Each LED chip 12 removed from the chip laying base 14 by the electrically conductive tube 104 is delivered to the light-emitting base 18 and the board 22 while being attracted by the electrically conductive tube 104. The LED chip 12 is prevented from being positionally displaced as much as possible when held by and detached from the electrically conductive tube 104. The LED chip 12 can be bonded quickly and efficiently with a highly simple process and arrangement.

As shown in FIG. 5, the electrically conductive tube 104 has the tapered end portion 118 which is progressively smaller in diameter away from the surface 102b. Whereas the upper electrode 140 of the LED chip 12 has a diameter of 0.17 mm, the tip end of the tapered end portion 118 has a diameter of 0.14 mm. Therefore, when the light-emitting state of the LED chip 12 is imaged by the CCD camera 74 through the magnifying optical system 76, the electrically conductive tube 104 does not serve as an obstacle, allowing the light-emitting state of the LED chip 12 to be recognized reliably.

As shown in FIG. 2, the movable tube 80 incorporating the support disk 102 which is rotatable by the θ-axis movable means 84 and vertically movable by the Z-axis movable means 86 is supported by the air bearing 78. Consequently, the movable tube 80 is allowed by the air bearing 78 to rotate and move vertically smoothly and accurately.

The joining member 116 projects through the through hole 112 in the support disk 102 from the surface 102a. The joining member 116 and the surface 102a are bonded to each other by the electrically conductive adhesive 117 such as silver paste, for example, which covers the small-diameter annular portion 114b of the electrically conductive film 114, as shown in FIG. 5. Therefore, the longitudinal dimension of the joining member 116 does not need to be established with high accuracy. The electrically conductive tube 104 and the support disk 102 can be positioned relatively to each other easily and reliably simply when the electrically conductive tube 104 is held closely against the surface 102b of the support disk 102.

Figure 16:
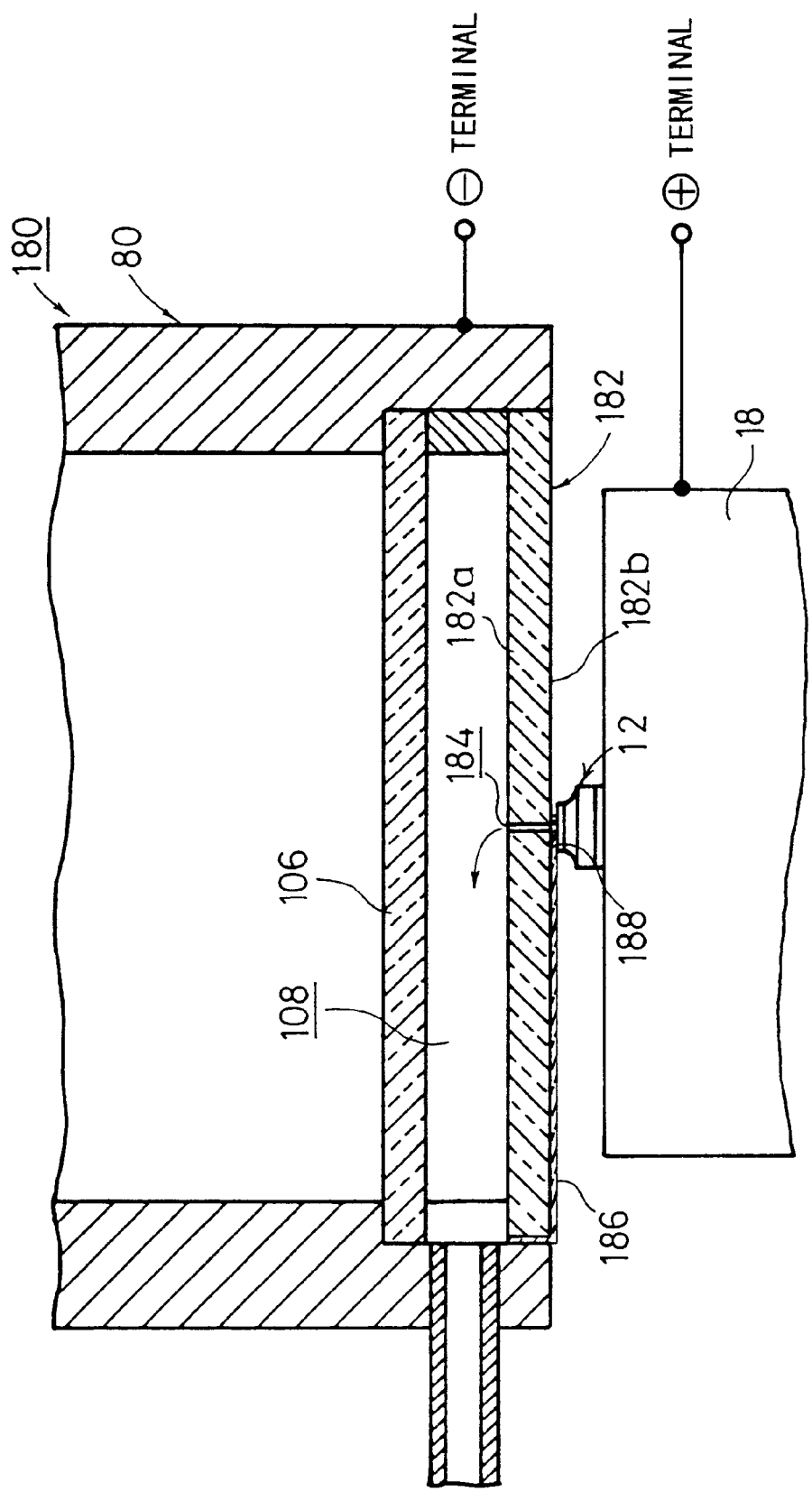
FIG. 16 is an enlarged fragmentary vertical cross-sectional view of a collet unit of a bonding apparatus according to a second embodiment of the present invention.
Figure 17:
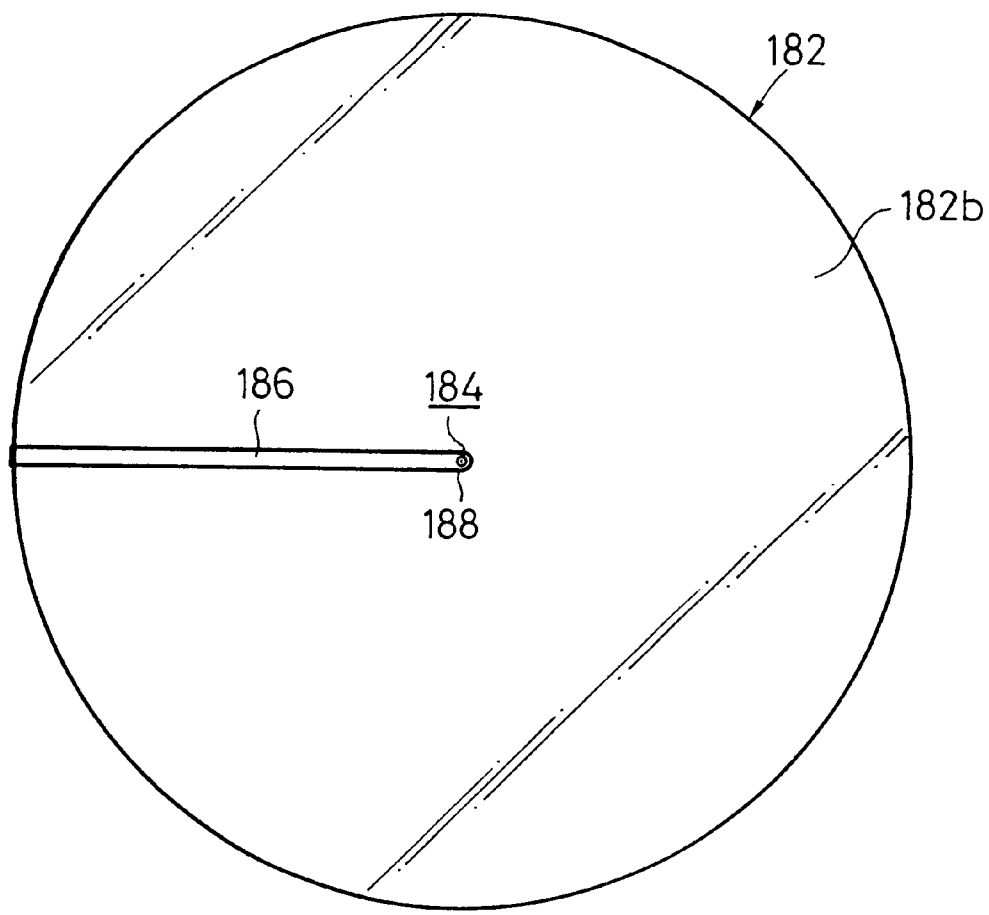
FIG. 17 is a plan view of a support disk of the collet unit shown in FIG. 16.

FIGS. 16 and 17 show a collet unit 180 of a bonding apparatus according to a second embodiment of the present invention. Those parts of the bonding apparatus shown in FIGS. 16 and 17 which are identical to those of the bonding apparatus according to the first embodiment are denoted by identical reference characters, and will not be described in detail below.

As shown in FIG. 16, the collet unit 180 has a light-transmissive support disk (light-transmissive support member) 182 which has a through hole 184 defined centrally therein. The through hole 184 has a diameter of 0.1 mm, for example. The support disk 182 supports a light-transmissive electrically conductive film 186 disposed on a surface 182b thereof opposite to a surface 182a thereof which faces the suction chamber 108. As shown in FIG. 17, the light-transmissive electrically conductive film 186 has a radially inner portion surrounding the through hole 184 and extends radially outwardly to an outer circumferential edge of the support disk 182. The light-transmissive electrically conductive film 186 has a thickness of 100 μm, for example. When the support disk 182 is mounted in the movable tube 80, the light-transmissive electrically conductive film 186 is electrically connected to the movable tube 80. The light-transmissive electrically conductive film 186 has a holder 188 for directly attracting and holding the LED chip 12 in its portion surrounding the through hole 184.

When the support disk 182 is lowered, the holder 188 of the light-transmissive electrically conductive film 186 on the surface 182b of the support disk 182 is brought into direct contact with the upper surface of the LED chip 12. With the LED chip 12 attracted under vacuum via the through hole 184, the DC power supply connected to the light-transmissive electrically conductive film 186 and the light-emitting base 18 supplies a current to energize the LED chip 12 to emit light.

In the second embodiment, therefore, while the LED chip 12 is being attracted by the holder 188, the light-emitting center of the LED chip 12 can be recognized reliably, and the LED chip 12 can be corrected in position for quick and accurate bonding on the board 22.

Figure 18:
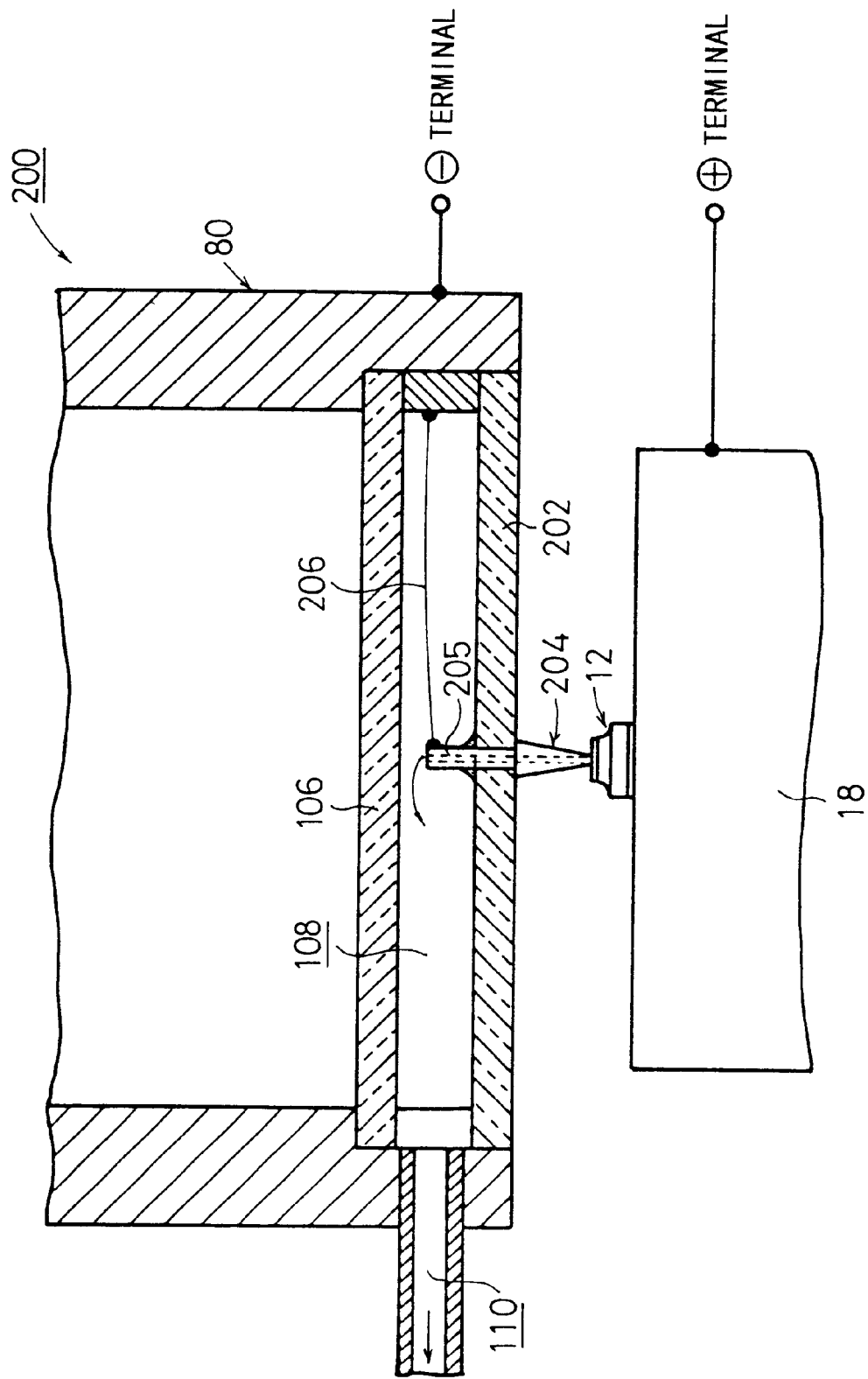
FIG. 18 is an enlarged fragmentary vertical cross-sectional view of a collet unit of a bonding apparatus according to a third embodiment of the present invention.

FIG. 18 shows a collet unit 200 of a bonding apparatus according to a third embodiment of the present invention. Those parts of the bonding apparatus shown in FIG. 18 which are identical to those of the bonding apparatus according to the first embodiment are denoted by identical reference characters, and will not be described in detail below.

The collet unit 200 does not have a light-transmissive electrically conductive film on a light-transmissive support disk (light-transmissive support member) 202. Rather, an electrically conductive member 206, such as an electrically conductive wire, for example, has an end electrically connected to a joining member 205 of an electrically conductive tube 204 serving as a holder fixed to the support disk 202, and an opposite end electrically connected to the movable tube 80. The bonding apparatus according to the third embodiment is relatively inexpensive because no light-transmissive electrically conductive film is disposed on the light-transmissive support disk 202.

In the first through third embodiments, the bonding apparatus is used to bond the LED chips 12 on the board 22. However, the bonding apparatus is applicable to the bonding of various components such as minute chips such as SLDs whose light-emitting centers need to be positioned highly accurately and chips of monolithic arrays.

With the bonding method and apparatus according to the present invention, while a light-emitting element is being held by the holder of the light-transmissive support member from the direction in which the light-emitting element emits light, the light-emitting element is energized to emit light, and the light-emitting state of the light-emitting element is imaged via the light-transmissive support member to recognize the light-emitting center of the light-emitting element. Therefore, the light-emitting state of the light-emitting element can be observed and detected accurately while the light-emitting element is being held by the holder. The light-emitting element can thus be positioned and bonded on the board at a desired bonding position thereon to position the light-emitting center thereof highly accurately. As a result, a highly accurate array of light-emitting elements can be fabricated efficiently.

Although certain preferred embodiments of the present invention have been shown and described in detail, it should be understood that various changes and modifications may be made therein without departing from the scope of the appended claims.

What is claimed is:

1. A method of bonding a light-emitting element on a board at a predetermined position thereon, comprising the steps of:

picking up and temporarily holding the light-emitting element with a holder integral with a light-transmissive support member from an area in which the light-emitting element emits light;

energizing the light-emitting element to emit light;

imaging a light-emitting state of the light-emitting element using an imaging means to obtain an image of said light-emitting element through said light-transmissive support member when the light-emitting element is being held;

determining a light-emitting center of the light-emitting element based on the imaged light-emitting state; and positioning and bonding the light-emitting element held by said holder on the board at a bonding position thereon based on the recognized light-emitting center.

2. A method according to claim 1, wherein the step of determining a light-emitting center comprises the steps of:

determining four sides of a light-emission image based on the imaged light-emitting state;

thereafter, determining points of intersection of said four sides; and determining a light-emitting center based on a point of intersection of diagonal lines passing through said points of intersection.

3. An apparatus for bonding a light-emitting element on a board at a predetermined position thereon, comprising:

a light-transmissive support member having a holder integral therewith, for picking up and temporarily holding the light-emitting element from an area in which the light-emitting element emits light;

light-emitting means for energizing the light-emitting element held by said holder to emit light;

imaging means for imaging a light-emitting state of the light-emitting element, wherein said imaging is obtained through said light-transmissive support member when the light-emitting element is being held;

image processing means for determining a light-emitting center of the light-emitting element based on the imaged light-emitting state; and a displacement mechanism for positioning the light-emitting element at a bonding position on the board based on the determined light-emitting center.

4. An apparatus according to claim 3, further comprising:

a light-transmissive cover member, said light-transmissive support member and said light-transmissive cover member jointly defining a suction chamber therebetween; and a negative pressure source connected to said holder through said suction chamber.

5. An apparatus according to claim 4, wherein said holder comprises an electrically conductive tube, said electrically conductive tube having a joining member projecting through a through hole defined in said light-transmissive support member into said suction chamber, said joining member having an end fixed by an adhesive to a surface of said light-transmissive support member which faces said suction chamber.

6. An apparatus according to claim 5, wherein said light-emitting means comprises a light-transmissive electrically conductive film disposed on said surface of said light-transmissive support member which faces said suction chamber, said joining member being fixed to said light-transmissive electrically conductive film by an electrically conductive adhesive.

7. An apparatus according to claim 5, wherein said light-emitting means comprises an electrically conductive member connected to said joining member.

8. An apparatus according to claim 5, wherein said electrically conductive tube-has a tapered portion which is progressively smaller in diameter away from said light-transmissive support member.

9. An apparatus according to claim 8, wherein said light-emitting means comprises a light-transmissive electrically conductive film disposed on said surface of said light-transmissive support member which faces said suction chamber, said joining member being fixed to said light-transmissive electrically conductive film by an electrically conductive adhesive.

10. An apparatus according to claim 8, wherein said light-emitting means comprises an electrically conductive member connected to said joining member.

11. An apparatus according to claim 4, wherein said light-emitting means comprises a light-transmissive electrically conductive film disposed on a surface of said light-transmissive support member which is opposite to said suction chamber, said holder comprising said light-transmissive electrically conductive film.

12. An apparatus according to claim 3, further comprising:

a movable tube disposed coaxially with said imaging means, said light-transmissive support member being mounted on said movable tube;

rotating means for rotating said movable tube; and moving means for moving said movable tube toward and away from said imaging means.

13. An apparatus according to claim 12, wherein said movable tube is rotatably supported by an air bearing.

* * * * *